United States Patent
LoForte et al.

(10) Patent No.: US 6,456,504 B1
(45) Date of Patent: Sep. 24, 2002

(54) SURFACE MOUNTED GROUNDING CLIP FOR SHIELDED ENCLOSURES

(75) Inventors: Steven LoForte, Copperton, UT (US); Mike Johnston, Tooele, UT (US); Tracy Boyd, Ogden, UT (US); Charles Eric Posey, Holladay, UT (US); Tom Johnson, Draper, UT (US)

(73) Assignee: 3Com Corporation, Santa Clara, CA (US)

( * ) Notice: Subject to any disclaimer, the term of this patent is extended or adjusted under 35 U.S.C. 154(b) by 146 days.

(21) Appl. No.: 09/703,514

(22) Filed: Oct. 31, 2000

(51) Int. Cl.$^7$ .............................. H05K 7/14; H05K 7/18
(52) U.S. Cl. .................. 361/799; 361/737; 361/787; 361/772; 439/92; 439/95
(58) Field of Search .................. 361/737, 816, 361/801, 799, 787, 784, 772; 439/92, 95; 174/51, 78

(56) References Cited

U.S. PATENT DOCUMENTS

| | | | |
|---|---|---|---|
| 3,803,533 A | * 4/1974 | Taplin | 439/328 |
| 5,011,424 A | 4/1991 | Simmons | 439/352 |
| 5,085,601 A | 2/1992 | Buchter et al. | 439/660 |
| 5,308,251 A | 5/1994 | Kaufman et al. | 439/64 |
| 5,330,360 A | 7/1994 | Marsh et al. | 439/95 |
| 5,452,184 A | 9/1995 | Scholder et al. | 439/92 |
| 5,537,294 A | 7/1996 | Siwinski | 361/753 |
| 5,547,397 A | * 8/1996 | Hirai | 439/607 |
| 5,554,821 A | 9/1996 | Patterson et al. | 174/52.2 |
| 5,594,204 A | 1/1997 | Taylor et al. | 174/52.2 |
| 5,653,598 A | 8/1997 | Grabbe | 439/66 |
| 5,677,511 A | 10/1997 | Taylor et al. | 174/52.2 |
| 5,836,774 A | 11/1998 | Tan et al. | 439/76.1 |
| 5,861,602 A | 1/1999 | Cox et al. | 219/121.64 |
| 5,879,170 A | 3/1999 | Nogami | 439/76.1 |
| 5,906,496 A | 5/1999 | DelPrete et al. | 439/92 |
| 5,957,703 A | 9/1999 | Arai et al. | 439/66 |
| 5,975,914 A | 11/1999 | Uchida | 439/66 |
| 6,000,956 A | 12/1999 | Henningsson et al. | 439/95 |
| 6,022,224 A | 2/2000 | Peters | 439/66 |
| 6,183,273 B1 | * 2/2001 | Yu et al. | 439/541.5 |
| 6,239,977 B1 | * 5/2001 | Price et al. | 337/297 |
| 6,252,166 B1 | * 6/2001 | Leschinger | 174/51 |
| 6,276,965 B1 | * 8/2001 | Madsen et al. | 439/108 |

* cited by examiner

Primary Examiner—David Martin
Assistant Examiner—Hung Bui
(74) Attorney, Agent, or Firm—Workman, Nydegger & Seeley

(57) ABSTRACT

A contact system is disclosed that includes a metal contact clip capable of being surface-mounted to a printed circuit board that facilitates the electrical coupling of the opposing conductive covers in a circuit card assembly having conductive enclosures with a reference potential, such as ground, on the printed circuit card which provide protection against electrostatic discharge (ESD) on the printed circuit card. The clip spans a cut-out region on the printed circuit card and includes opposing tabs the extend from the spanning portion for electrically contacting the conductive covers. The clip further includes geometries such as springs for exerting forces upon the conductive covers thereby providing a reliable contact interface with the conductive covers.

14 Claims, 6 Drawing Sheets

SURFACE MOUNTED GROUNDING CLIP FOR SHIELDED ENCLOSURES

BACKGROUND OF THE INVENTION

1. The Field of the Invention

The present invention relates to electrical connections. More particularly, the present invention relates to printed circuit boards and electrical grounding thereof. In particular, the present invention relates to a cover-to-cover grounding contact clip in an electronic peripheral card for the control and management of electromagnetic interference and electrostatic discharge.

2. The Relevant Technology

The proliferation of personal computers has caused a large demand for expansion boards to enhance computer functionality. With older personal computers, expansion boards were mounted internally and therefore required the computer cover to be removed before installation thereof. The advent of electronic devices such as laptop and notebook personal computers, handheld computers, and other devices such as personal digital assistants (PDAs) necessitated the development of a portable expansion board. Such a portable expansion board has been referred to as a peripheral card with one standard configuration being a PCMCIA card. PCMCIA cards are insertable in external slots of laptops, notebooks, sub-notebooks, and other hand-held devices such as PDAs. The small size of these electronic devices and their portability facilitates the interchange of functionality by installing and removing different peripheral cards into the external slots of the computer or other electronic device. Typical peripheral cards include modems, wireless communicators, and memory expansion inserts.

Because these peripheral cards may be removed from the electronic device, both their installation and their operation within the electronic device may trigger electrostatic discharge (ESD) or also electromagnetic interference (EMI) during operation. An electrostatic charge may build-up on any conductive surface of a peripheral card and as such, ESD may cause damage to both the electronic components within the peripheral card as well as the electronic device into which the peripheral card is inserted. An ESD therefore must be properly managed for such peripheral cards. An effective discharge path to a ground source, such as a computer chassis, is needed from any major surface area of the card.

Another desirable design goal is that the peripheral card be adequately shielded against radiating or receiving EMI. The shield must have a sufficiently low ohmic resistivity such that no anticipated electromagnetic energy can penetrate it. The shield therefore must have the function of both adequate thickness and adequate ohmic resistance. Currently, peripheral cards such as PCMCIA cards are constructed with a relatively thin two-sheet, metal shield that can provide adequate shielding at all anticipated frequencies. The shield also needs to provide a conductive surface area in order to allow for a substantially continuous current flow through the shield surface to ground. If a discontinuity arises between the shield and the leads to ground, a slot antenna is created and EMI can penetrate the peripheral card or it can be generated by the peripheral card such that it interferes with the larger electronic device.

Several packaging methods have been developed for the construction of peripheral cards that assist to provide ESD and EMI protection. When an insufficient electrical conduction path to ground exists, many problems may arise during operation of the peripheral card and it may also cause problems during operation of the electronic device with which the peripheral card is connected. To overcome EMI problems, it is therefore preferable to increase the ground-to-signal ratio in a PCB to improve the signal flow therethrough which enhances signal transmission performance of the peripheral card. Additionally, where a PCB does not have proper connection to ground, the PCB can suffer from not only EMI interference problems, but also ESD problems which may arise due to the live electronic components on the peripheral card which may arc to the card's metallic shield.

ESD may also occur when two device surfaces exhibit a sufficient difference in electrical potential resulting from varying electrical charge on each surface. Such a condition forms an electrostatic capacitor between the two devices which emits electrostatic electrons that may also interfere with the performance of the related devices and other peripherals. When these charged surfaces abruptly encounter each other, such as when an electrical card and a related card connector are coupled together, an electrostatic discharge may result thereby causing damage to the components within the electrical card.

Several arrangements have been made in the art to provide adequate PCB-to-ground paths for peripheral cards. One example is a compression spring that is constrained in a pocket of the package frame for extendable portions of a peripheral card. The compression spring must be fitted onto the frame pocket by hand, it is small, and because it is a separate external piece, it may be easily lost.

Another example is a clip that is soldered to one side of the peripheral card's PCB. The soldered clip has the problem that it requires hand-soldering and handling and that a multiple number of clips may be required to accomplish a cover-to-cover contact for the peripheral card.

Another article that has been used to deal with both EMI and ESD is a clip that is crimped to the plastic frame of a peripheral card such as a PCMCIA card and that makes electrical contact with both the upper metallic sheet and the lower metallic sheet. Additionally, a portion of the clip has a tab that extends therefrom and makes electrical contact with an electrically conductive pad on the PCB. The crimped clip, because of its extremely thin nature, can become damaged due to conventional handling during assembly. Additionally, the tab, because it extends beyond the frame, may require intensive labor to install and to crimp. Additionally, the clip cannot be reworked and the tab may not make adequate contact with the pad on the PCB. Additionally, there are multiple steps of manufacture and assembly which are wasted if a subsequent process causes damage.

Another device that has been used to manage EMI and ESD is a formed tab that is integral to the metallic shield. As with the clip on the PCB and tab in the crimped clip, the formed tab can be easily damaged during assembly and may not make adequate contact with the PCB. It is also flimsy and potentially unreliable because its resilience may be damaged.

Another article that has been used for EMI and ESD management is a gasket material that is compressed between one of the metallic shields and the PCB. The gasket material, however, may not remain intact or in its proper orientation. As such, it may cause irreparable damage to electronic components contained in the peripheral card and it requires a great deal of handling to assemble.

As with all of these prior art attempts for EMI and ESD protection, where proper contact is not made, the peripheral card can become susceptible to ESD or act as an antenna and/or create unwanted electromagnetic emissions. Additionally, if a metal shielded connector with contact tabs is used as part of the peripheral card, and the contact tabs do not make proper contact, the peripheral card can become an antenna.

Another configuration that contains both EMI and ESD is the placement of a ground trace around the outer perimeter of a PCMCIA card, followed by the overmolding of the PCB with a first dielectric material, and a second conductive material with the placement of a conductive adhesive and a metallic sheet upon the adhesive material. The packaging of a PCMCIA card after this fashion allows for the dissipation of both EMI and ESD. This configuration has several drawbacks including (i) a substantially permanent sealing off of the PCB surface, (ii) the overmolding's blanket effect that prevents cooling of the PCB components, (iii) poor electrical conductivity through the electrically conductive adhesive and (iv) a very large portion of the card's surface area occupied by the ground trace.

FIG. 1 depicts yet another configuration for providing electrical continuity between the printed wiring board and the shielding covers surrounding a module. In FIG. 1, an exploded elevational view of typical components in a prior art peripheral card such as a PCMCIA card are shown. As can be seen, a PCMCIA assembly 10 includes an upper or first metallic sheet or cover 12, a printed wiring or circuit board 14, a connector such as a multiple-socket connector 16 (typically used for interfacing with a host device or computer) that attaches to one end of circuit board 14, and a lower or second metallic sheet or cover 20. Assembly 10 further comprises a connector 22 for interfacing with a communication network and is depicted as a retractable connector. Assembly 10 is further comprised of a connector 18 for generally providing an additional digital interface to circuit board 14. In several implementations, connector 18 provides a cellular or wireless interface for coupling with wireless transceivers or other digitally-interfacable devices.

To simplify manufacturing of assembly 10, connector 18 is encompassed by a shielding cover 24 which includes shielding cover contact tabs 26 that provide conductive electrical contact with top or first cover 12 through a spring expansion tab contact interface. Connector 18 further includes a shielding circuit board connection tab 28 for electrically interfacing with a connector shielding pad 30 on circuit board 14. This configuration provides electrical contact between the top cover 12 and the circuit board's ground structure. Connector 24 includes tabs symmetrical to tabs 26 on the lower side for electrically interfacing with bottom or second cover 20 thereby electrically coupling the ground plane of circuit board 14 with both top and bottom covers 12, 20.

As the miniaturization increases for peripheral devices, the "real estate" comprising the available surface on both sides of the PCB becomes more valuable, and structures that suppress both EMI and ESD occupy needed room on the PCB surface. Furthermore, as commonality between successive product assemblies is extended, it is desirable for manufactures to design fewer unique electrical circuit boards for spanning related product lines. Therefore, manufactures may vary configurations of designs by deleting or replacing components without entirely redesigning electronic circuits and mechanical assemblies.

Other problems arise when clips or other connections are made at the periphery of the PCB. For example, clips or tabs placed on the edge of the PCB exert forces on the sidewalls of the module covers which in turn induce rotational motion in the PCB. Such motion causes the PCB and connectors attached thereon to slide within the external enclosure that provides the physical alignment of the module with the computer. Such misalignment of the connectors of the PCB with the receiving computer results in a glancing contact and may even result in damage to connector contact pins and sockets.

Additionally, due to manufacturing robotics and automated processes as well as the miniaturization of electronic circuits and their components, it would be an advancement in the art to provide a shielding coupling system that could be robotically place and processed in a manner consistent with the other components of an electronic assembly without requiring non-standard or even manual assembly.

Thus, what is needed in the art is a structure for an assembly that addresses the ESD and EMI concerns in those assemblies and, further, can be subjected to similar assembly and manufacturing processes as the assemblies traditional components.

SUMMARY OF THE INVENTION

The present invention relates to an electrostatic (ESD) surface-mount clip for electrically coupling a printed circuit board (PCB) with opposing conductive covers in a module assembly such as a PCMCIA card. The ESD surface-mount clip is an article of manufacture that includes an integrally conductive profile for providing electrical continuity between a ground pad on the PCB and the opposing covers. The ESD surfacemount clip is comprised of a generally planar electrically conductive spanning means for spanning a cut-out or other opening on a printed circuit board that facilitates electrically coupling from one conductive cover of an electronic assembly to the opposing side or cover of the electronic assembly. The clip further includes surface mount pad that are integrally attached or formed from the same conductive material. The pads facilitate the bonding of the clip with the printed circuit board. The spanning means is formed to include opposing tabs, one extending in a direction toward a first cover and another extending in a generally opposing direction to encounter the opposing or second cover. A spanning member generally couples between the opposing tabs to form support or electrical continuity therebetween.

The ESD surface-mount clip of the present invention finds applications in modules where an exposed contact pad, generally a grounding pad, is located near the periphery of a cut out region on the PCB. Such open and available ground pads are regularly present in module embodiments wherein particular components such as connectors that would otherwise provide the continuity mechanism are absent. Such absence of components is common in electronic component families that reuse standardized PCB designs over a variety of mutated products.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawing depict only typical embodiments of the invention and are not therefore to be considered to be limiting of its scope, the invention will be described and explained with additional specificity an detail through the use of the accompanying drawings in which.

DETAILED DESCRIPTION OF THE INVENTION

Figure 1:
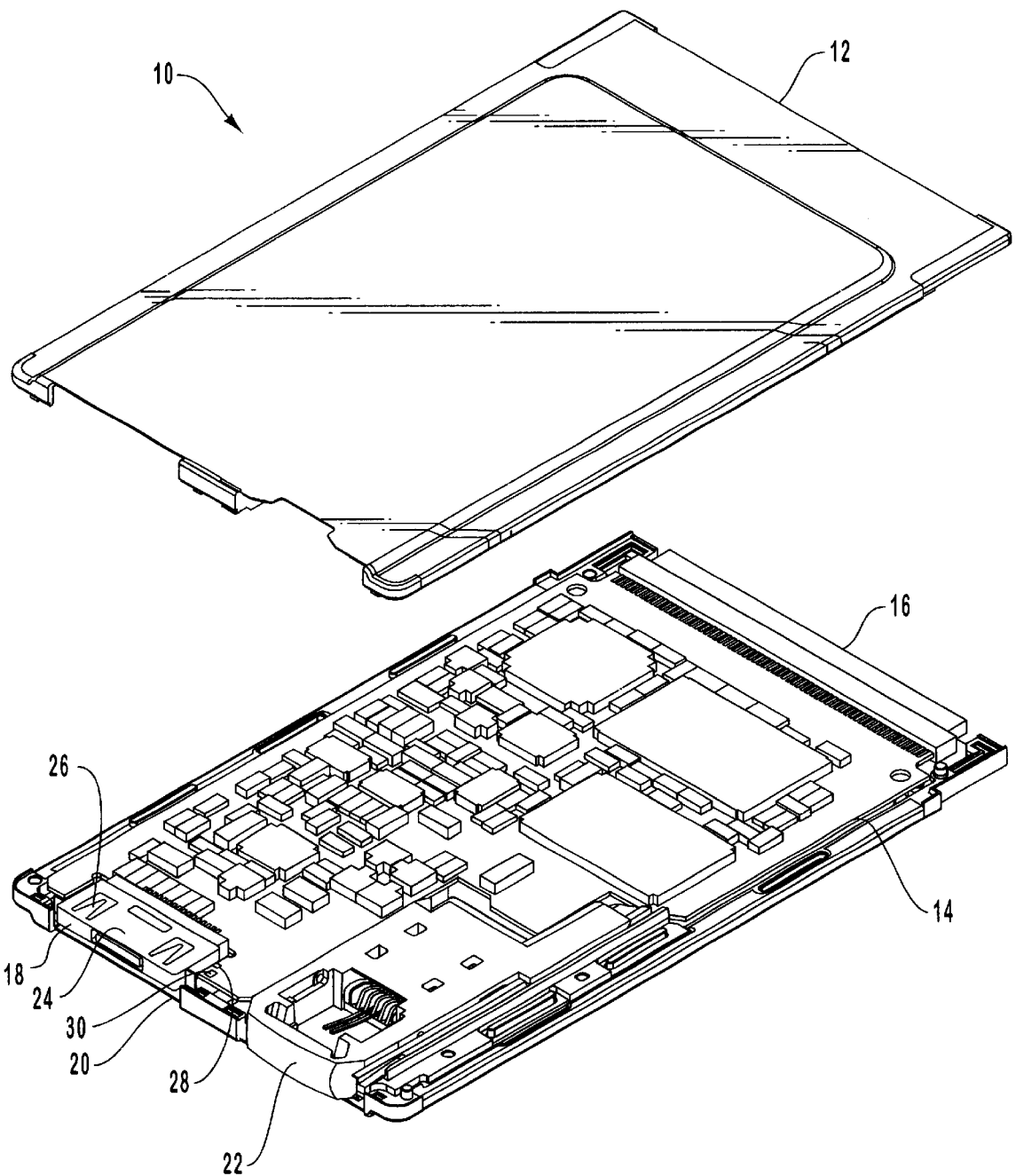
FIG. 1 is an exploded perspective view of selected components of a PCMCIA card.

FIG. 1 is an exploded elevational view of typical component in a prior art peripheral card such as a PCMCIA card. As can be seen, a PCMCIA assembly 10 includes an upper metallic sheet or cover 12, a printed circuit board (PCB) 14, a connector such as a multiple-socket connector 16, that attaches to one end of PCB 14, a communication connector 22 for interfacing with the communication network, that attaches to another portion of PCB 14, and a second communication connector 18, also mounted to yet another portion of PCB 14. It should be recalled that connector 18, in prior art implementations is further comprised of a shielding cover 24 for providing electrical continuity between first cover 12, grounding tracks on PCB 14, and second cover 20.

Figure 2:
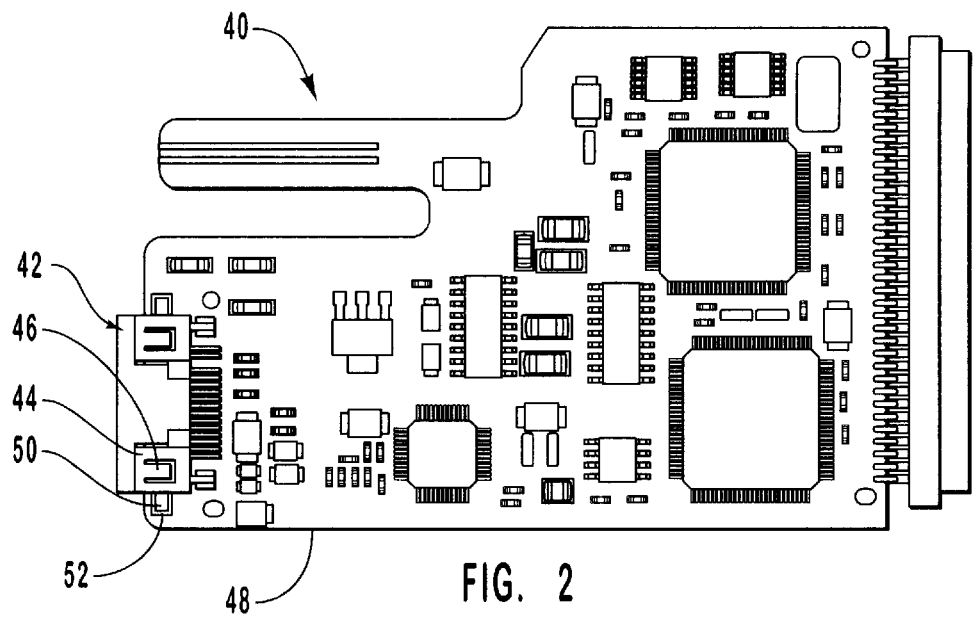
FIG. 2 is an elevational top view of a fully populated circuit board.

FIG. 2 is an elevational front view of a fully populated printed circuit board 40. The term "fully populated" implies that the printed circuit board includes thereon various components, and particularly a shielded connector 42 providing a communication data interface with printed circuit board assembly 40. Shielded connector 42 further depicts connector shielding 44 generally, and shielding cover contact tabs 46, specifically. Contact tabs 46 are electrically connected to the printed circuit board via shielding circuit board connector tabs 50 which are electrically connected, preferably soldered, to connector shielding pad 52 on printed circuit board 48.

Contact tabs 46 on connector shielding 44 extend or cantilever away from the general topical plane of connector shielding 44 to provide compressive contact with a first cover thereby facilitating a common potential reference between first cover and a printed circuit board. Likewise, but not shown in FIG. 2, are opposing shielding cover contact tabs projecting from the general plane of the back portion of shielded connector 42 for providing compressive electrical contact with a second cover to further provide a common electrical potential reference between both first and second covers and printed circuit board 48.

Figure 3:
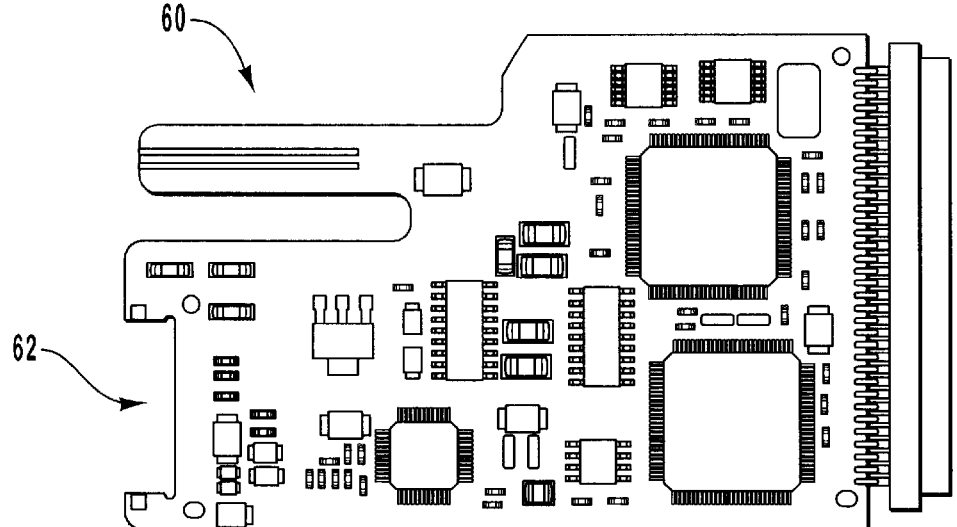
FIG. 3 is an elevational top view of an alternatively portionally populated circuit board.

FIG. 3 is an elevational front view of a partially populated printed circuit board assembly 60 wherein shielded connector 42 (FIG. 2) has been depopulated as specified by a particular configuration not requiring the presence of shielded connector 42. FIG. 3 more clearly illustrates a connector cutout 62 wherein shielded connector 42 (FIG. 2) may be received and electrically and mechanically coupled to printed circuit board 48 for applications wherein shielded connector 42 provides electrical coupling between first and second covers and printed circuit board 48, via shielding cover contact tabs 46 and connector tabs 50.

In FIG. 3, no continuity between a first and second cover and printed circuit board 48 would exist in the absence of shielded connector 42. Therefore, the absence of shielded connector 42 having contact tabs for coupling the covers and the printed circuit board potentials together, creates an undesirable ESD and EMI condition.

Figure 4:
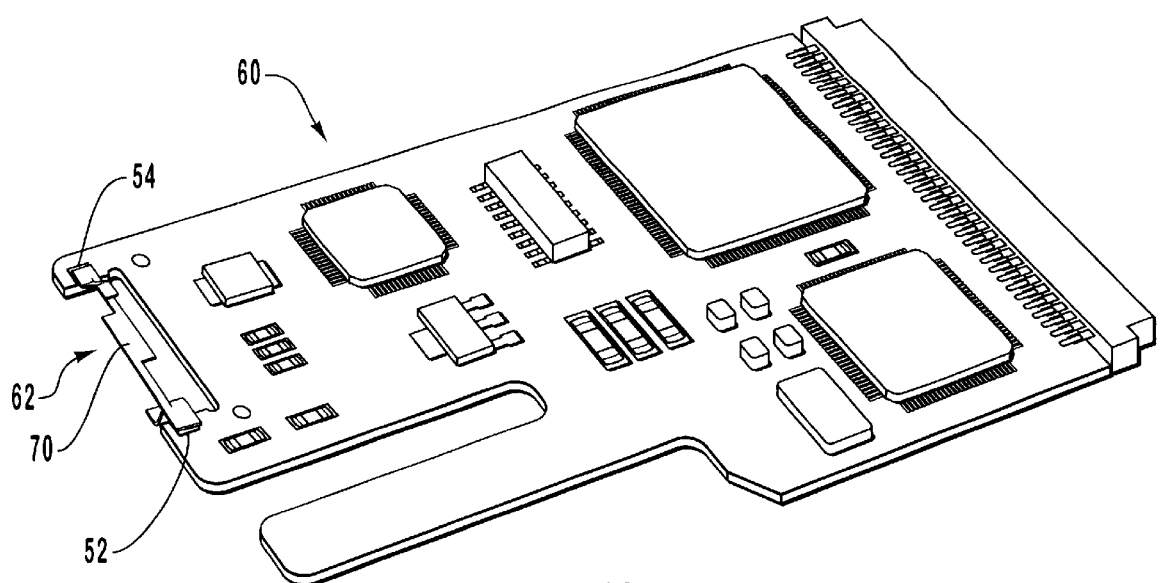
FIG. 4 is an elevational top view of a partially populated circuit board having a first alternate printed wiring board surface-mount clip assembly attached thereto.

FIG. 4 is an elevational top view of PCB assembly 60, as depicted in FIG. 3, having a means for electrically coupling the potential of both the first and second covers (FIG. 8) of the module assembly such as PCMCIA assembly 110 (FIG. 8) with the ground or reference potential of PCB 48. Those of skill in the art appreciate that coupling of the various potential references resident within a module to a standard potential, such as ground, results in improved EMI performance as well as a reduction in ESD sensitivity. By way of example, and not limitation, the means for providing such coupling of electrical isolation is depicted in FIG. 4 as ESD surface-mount clip 70. While the profile and configuration of ESD surface-mount clip 70 follows in subsequent figures, placement or the location of ESD surface-mount clip 70 in PCB assembly 60 is presently described. It should be recalled, and is appreciated by those of skill in the art, that various models or families of products such as the module assembly described herein, may reuse a standard or near standard PCB 48 for various models or iterations of module assemblies.

As described herein, module assemblies incorporating a connector into connector cutout 62 may rely on the shielding associated with such a connector for tying or coupling the various electrical potentials together. However, those assembly models not incorporating such a connector must still tie or electrically link the various electrical potentials together. By way of example, and not limitation, FIG. 4 depicts ESD 11 surface-mount clip 70 reusing connector shielding pads 52, 54 as the electrical contacts on PCB 48 to which ESD surface-mount clip 70 attaches. In a first embodiment, ESD surface-mount clip 70 is comprised of a generally planar electrically conductive rigid spanning member with opposing tabs cut from portions of the spanning member and formed to provide electrical coupling of both upper and lower covers together with a reference (e.g., ground) on PCB 48. It should be appreciated that ESD surface-mount clip 70 may be attached to other shielding pads or any other pad providing an electrical path to the common reference on PCB 48.

While the surface-mount clip is depicted as replacing electrically conductive shielding on a connector place in a connector cut-out on a printed circuit board, it should be appreciated that the surface-mount clip may be placed anywhere on a printed circuit board where an aperture or cut-out exists such that the opposing ridges or tabs may reach the covers when the end tabs are surface mounted to the printed circuit board.

Figure 5:
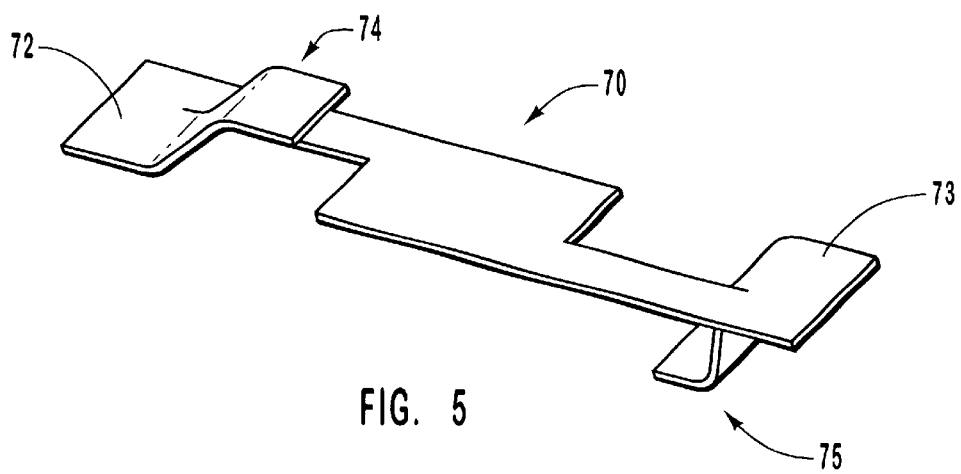
FIG. 5 is a perspective view of a surface-mount clip assembly, in accordance with a preferred embodiment of the present invention.

FIG. 5 depicts a perspective view of ESD surface-mount clip 70 in accordance with the preferred embodiment of the present invention. ESD surface-mount clip 70 is comprised of various segments and profiles formed preferably from a continuous strand or blank of conductive material, preferably low resistance metallic compositions capable of retaining a resilient profile following formation of the various geometries and members. ESD surface-mount clip 70 is preferably formed of spring steel capable of exerting both compressive and expansive forces when subjected to various installation processes.

It should be apparent from FIG. 5 that ESD surface-mount clip 70 assumes a generally planar profile with opposing tabs 74, 75 cut, formed and extending therefrom. Generally, surface-mount clip 70 is surface-mounted to PCB 48 (FIG. 4) using surfacemount soldering techniques. Once affixed to the printed circuit board, surface-mount clip 70 provides electrical continuity to the exterior covers 112, 120 (FIG. 8) by way of compressive contact between tabs 74, 75 when covers 112, 120 are assembled about printed circuit board 48 (FIG. 4).

Figure 6:
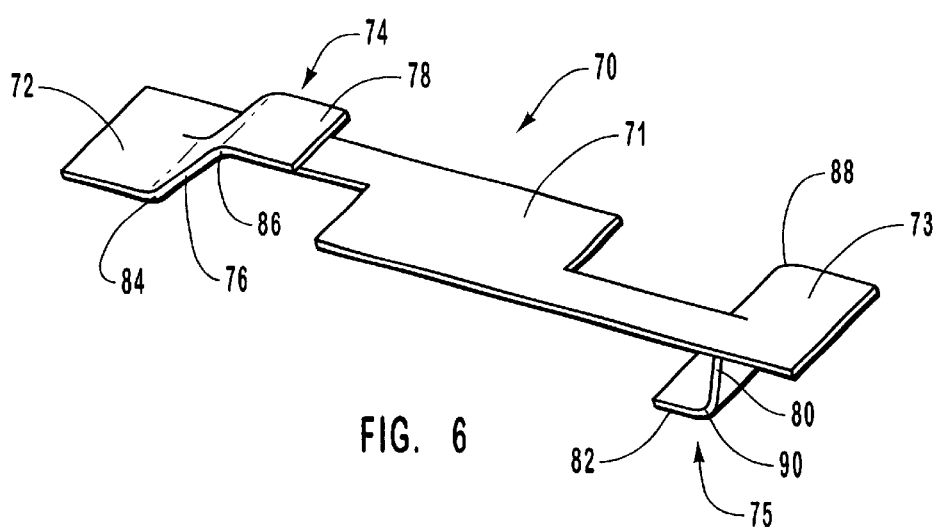
FIG. 6 is a perspective side view of a surface-mount clip assembly, in accordance with the preferred embodiment of the present invention.

FIG. 6 depicts a slightly perspective side view of ESD surface-mount clip 70, in accordance with a preferred embodiment of the present invention. As described, ESD surface-mount clip 70 is preferably comprised of an electrically conductive integral member comprised of a plurality of sub-members and geometries. Surface-mounted clip 70 is comprised of a surface-mountable pad 72 and an opposing surface-mountable pad 73. Pads 72, 73 preferably define the terminal ends of surface-mount clip 70, although additional profiles are also contemplated which include other tabs that provide additional reference contact points, even with the covers. Pads 72, 73 are preferably a planar conductive material for compatible surface mounting with printed circuit board pads, such as pads 52,54 (FIG. 4) on printed circuit board 60. Those of skill in the art appreciate the specific size ratios between printed circuit board shielding pads 52, 54 and surface-mount clip pads 72, 73 are factor-dependent but are calculable. Such factors include the type and consistency of the solder paste as well as other related factors. A described, ESD surface-mount clip 70 is designed for installation on PCB 48 using surface-mount processing techniques. Installation of ESD surface-mount clip 70 occurs by spanning surface-mount clip 70 across a cut-out or other aperture such as cut-out 62 (FIG. 3).

ESD surface-mount clip 70 is further comprised of a spanning means for providing spacing between pads 72, 73 and for providing a surface from which cover contact members may be formed and exhibit leverage thereto. By way of example and not limitation, a spanning means is comprised of a spanning member 71 and a first cover tab 74 and an opposing second cover tab 75. In the present embodiment, spanning member 71 provides the skeletal structure of the spanning means by providing a contact interface for tabs 74, 75.

In the present embodiment, tabs 74, 75 are formed by shearing or otherwise separating a portion of the spanning means for each tab from spanning member 71 while retaining an integral interface with spanning member 71 to provide the pivot point about which tabs 74, 75 flex. While FIG. 6 depicts tabs 74, 75 as pivoting nearest pads 72, 73 and extending away therefrom, it is also contemplated that tabs may be integral with the spanning member at a midpoint and extend in the direction of the pads.

Tabs 74, 75 may assume various profiles including being comprised of generally planar members or generally curved members. In FIG. 6, tabs 74, 75 are depicted as each being comprised of two integral members formed, preferably by bending. Tab 74 is comprised of an extension member 76 preferably integral with spanning member 71 and flexed or bent at an angle therefrom forming a spring 84. Tab 74 is further comprised of a cover contact member 78 which is preferably integrally and angularly coupled to extension member 76 by way of a spring 86 and provides the physical contact interface with a cover such as first cover 112.

Figure 7A:
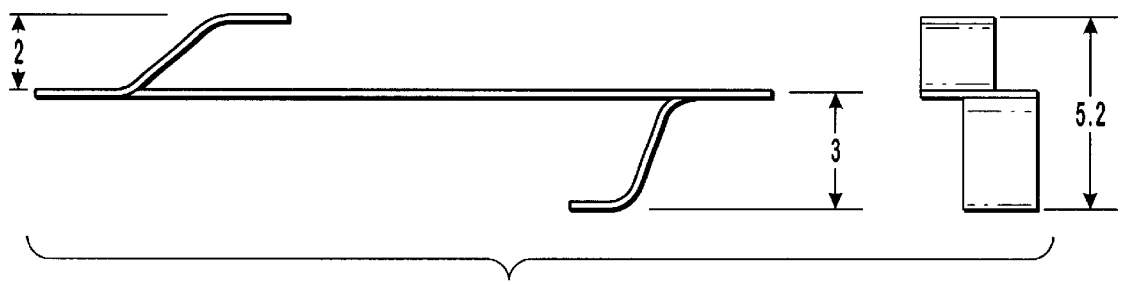
FIG. 7 is a schematic of an exemplary embodiment proportions of a surface-mount clip assembly, in accordance with a preferred embodiment of the present invention.
Figure 7B:
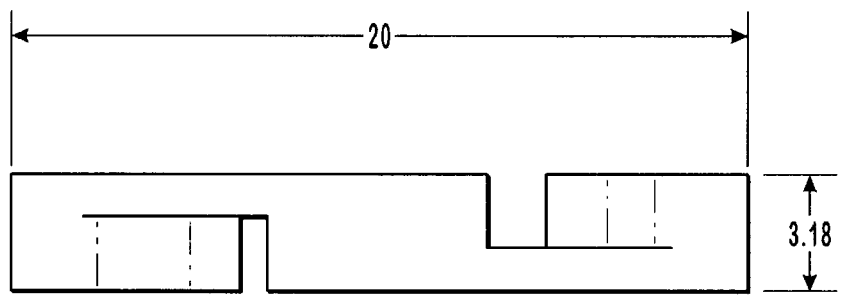

Tab 75 is specifically a mirror image of tab 74 in that tab 75 is comprised of an extension member 80, integrally coupled to spanning member 71 by spring 88, and a cover contact member 82, integrally coupled to extension member 80 by way of a spring 90, for directly interfacing with an opposing cover such as second cover 120. Tab 74 and tab 75 may vary in proportion due to factors such the spatial placement of the printed circuit board between the opposing covers. For example, if the components on the printed circuit board are of equal heights on both sides of the printed circuit board and the printed circuit board is centrally located between the covers, and the surface-mounted clip must necessarily be mounted on one side of the printed circuit board, then it follows that the extension member reaching from the surface-mounted clip mounted on a first side of the printed circuit board must necessarily be longer to reach the cover on the opposing side of the assembly. Such asymmetry is depicted in the schematics of FIGS. 7A and 7B.

Figure 8:
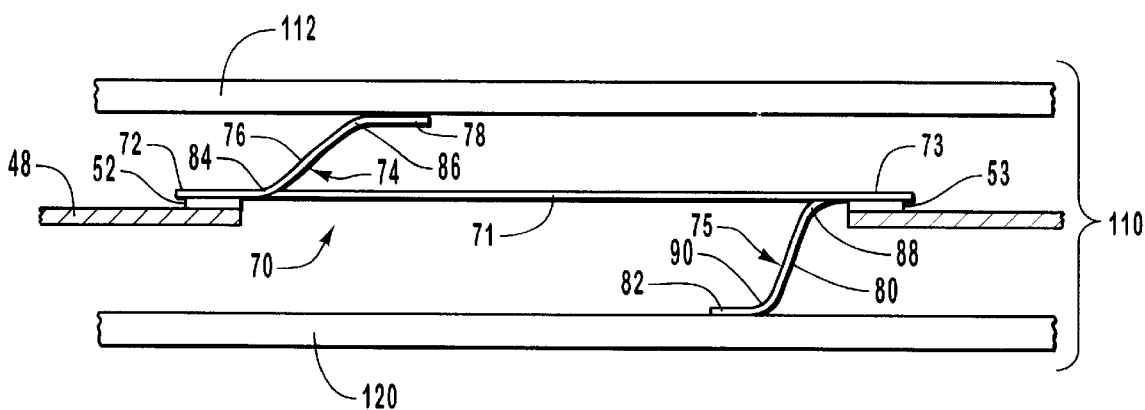
FIG. 8 is a cross section diagram of an assembly incorporating the inventive surface-mount clip, in accordance with a preferred embodiment of the present invention.

FIG. 8 depicts a cross-sectional view of module assembly 110. While module assembly 110 has been described in one embodiment, as assuming a PCMCIA configuration, other custom and standardized architectures may also be employed which incorporate a PCB sandwiched between top and bottom covers. FIG. 8 depicts PCB 48 having shielding pads such as a connector shielding pads 52, 53 upon which the surface-mount clip 70 is mounted.

Module assembly 110 is further comprised of first cover 112 and second cover 120. First cover 112 is brought within proximity of ESD surface-mount clip 70, and in final assembly, imposes a compressive force on top cover contact member 78 as exerted by first and second springs 84, 86. To provide reliable electrical conductivity across manufacturing tolerances, springs 84, 86 exert expansive forces against first or top cover thereby providing a reliable electrically conductive interface.

Similarly, the positioning of second or bottom cover 120 in proximity to ESD surface-mount clip 70 also subjects ESD surface-mount clip 70 to a compressive force particularly about tab 75. To further the electrically conductive interface to second cover 120, ESD surface-mount clip 70, via springs 88, 90 exert expansive forces on second cover 120 thereby facilitating a electrically conductive interface.

Figure 9:
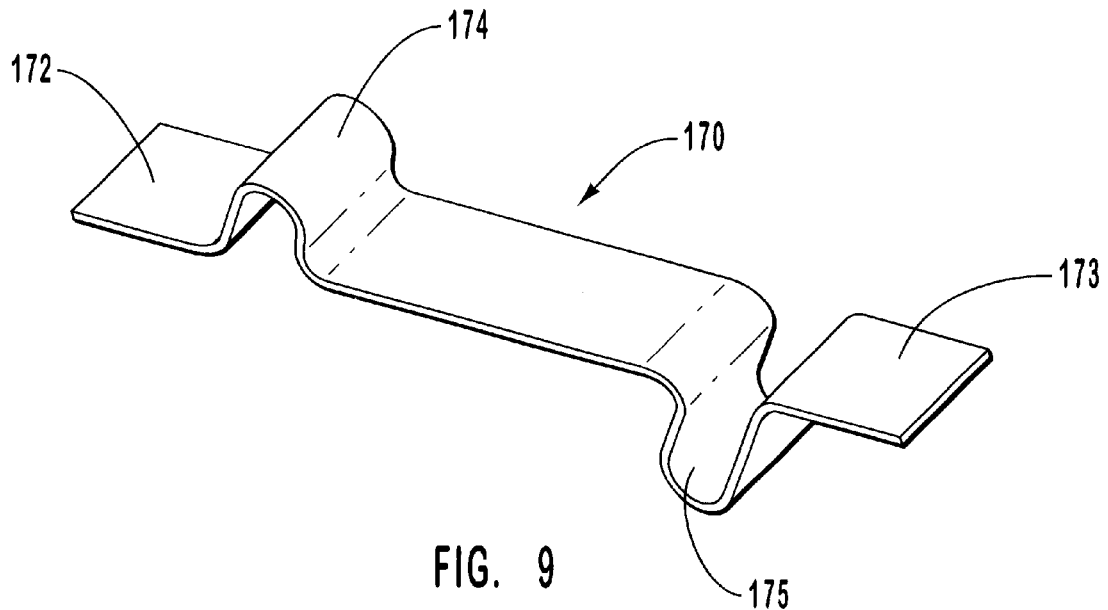
FIG. 9 is a perspective view of an alternative embodiment surface-mount clip assembly, in accordance with another preferred embodiment of the present invention.

FIG. 9 depicts a perspective view of ESD surface-mount clip 170 in accordance with another embodiment of the present invention. ESD surface-mount clip 170 is comprised of various segments and profiles formed preferably from a continuous strand or blank of conductive material, preferably low resistance metallic compositions capable of retaining a resilient profile following formation of the various geometries and members. ESD surface-mount clip 170 is preferably formed of spring steel capable of exerting both compressive and expansive forces when subject to various installation processes.

It should be appreciated from FIG. 9 that ESD surface-mount clip 170 originated as a generally planar profile from which opposing tabs 174, 175 are formed and extend therefrom. Generally, surface-mount clip 170 is surface-mounted to PCB 48 (FIG. 4) using surface-mount soldering techniques. Once affixed to the printed circuit board, surface-mount clip 170 provides electrical continuity to the exterior covers 112, 120 (FIG. 8) by way of compressive contact between tables 174, 175 when covers 112, 120 are assembled about printed circuit board 48 (FIG. 4).

Figure 10:
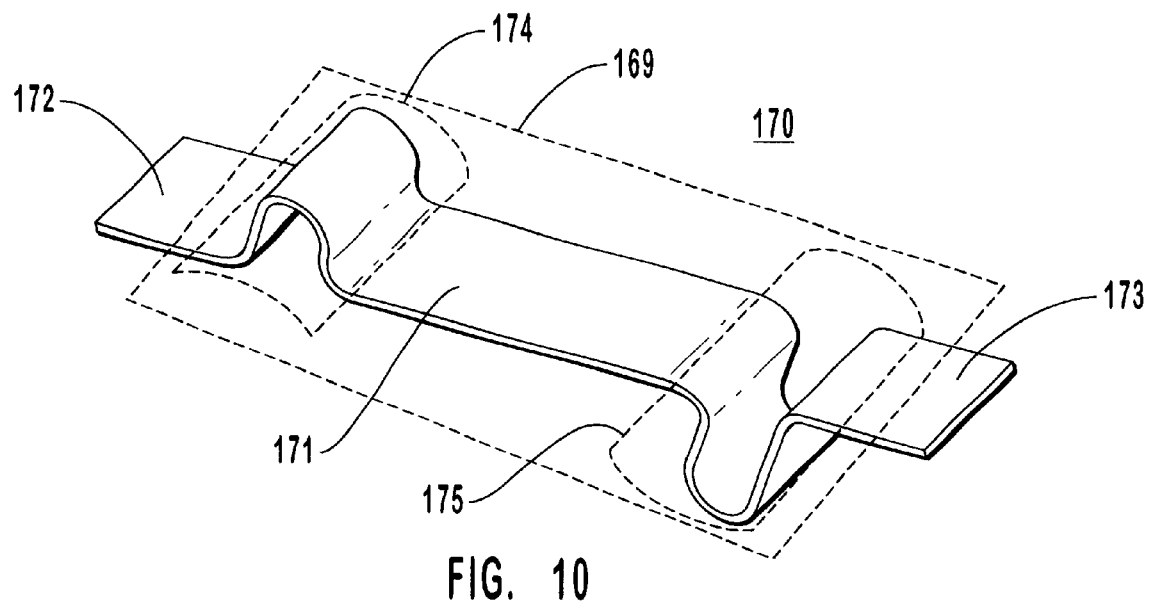
FIG. 10 is a perspective side view of an alternate embodiment surface-mount clip assembly, in accordance with another preferred embodiment of the present invention.

FIG. 10 depicts a more detailed elevational/perspective side view of ESD surface mount clip 170, in accordance with another embodiment of the present invention. As described, ESD surface-mount clip 170 is preferably comprised of an electrically conductive integral member comprised of a plurality of sub-members and geometries. Surface-mount clip 170, is comprised of a surface-mountable pad 172 and an opposing surface-mountable pad 173. Pads 172, 173 preferably define the terminal ends of surface-mount clip 170, although additional profiles are also contemplated which include other tabs that provide additional reference contact points, even with the covers. Pads 172, 173 are preferably a planar conductive material for compatible surface mounting with printed circuit board pads, such as pads 52,54 (FIG. 4) on printed circuit board 60. Those of skill in the art appreciate the specific size ratios between printed circuit board shielding pads 52, 54 and surface-mount clip pads 172, 173 are factor-dependent but are calculable. Such factors include the type and consistency of the solder paste as well as other related factors. A described, ESD surface-mount clip 170 is designed for installation on PCB 60 using surface-mount processing techniques. Installation of ESD surface-mount clip 170 occurs by spanning surface-mount clip 170 across a cut-out or other aperture such as cut-out 62 (FIG. 3).

ESD surface-mount clip 170 is further comprised of a spanning means for providing spacing between pads 172, 173 and for providing a surface from which cover contact members may be formed and exhibit leverage thereto. By way of example and not limitation, a spanning means is comprised of a spanning member 171 and a first cover tab 174 and an opposing second cover tab 175. In the present embodiment, spanning member 171 provides the continuous structural interface of the spanning means between tabs 174, 175.

In the present embodiment, tabs 174, 175 are formed by forming a portion of the spanning means for each tab from spanning means 169 while retaining an integral interface with spanning member 171. It should also be appreciated that spanning member 171 could assume a minimal to non-existent length as the terminal end, for example, of tab 174 could be directly coupled to the initial end of tab 175. Tabs 174, 175 may assume various profiles including being comprised of generally planar members or generally curved members. In FIG. 10, tabs 174, 175 are depicted as each being comprised of a generally radially curved semi-circular member for electrically contacting the respective covers and generally straight members on each side of the semi-circular profile of the curved member for providing continuity between the tab member and the pad and spanning member 171. Various springs result from the contour of the tab structure which results in spring forces for exertion upon the covers.

Figure 11A:
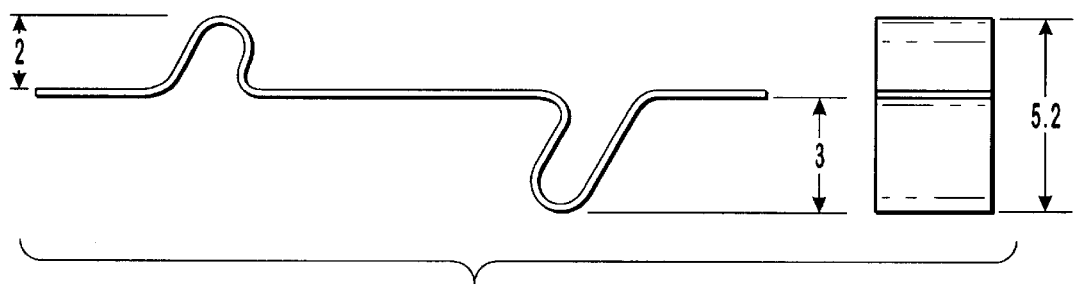
FIG. 11 is a schematic of an exemplary embodiment proportions of an alternate embodiment surface-mount clip assembly, in accordance with another preferred embodiment of the present invention.
Figure 11B:
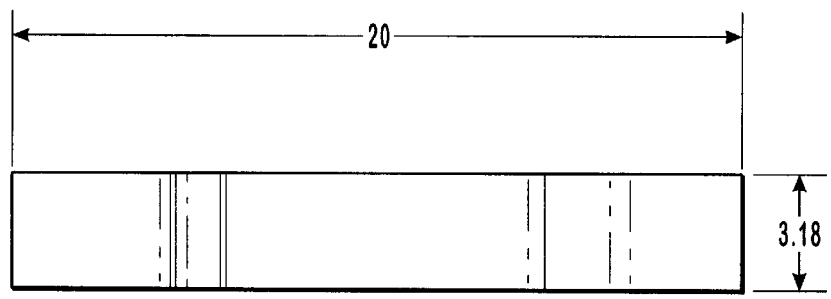

Tab 175 is specifically a mirror image of tab 174 for directly interfacing with an opposing cover such as second cover 120. Tab 174 and tab 175 may vary in proportion due to factors such the spatial placement of the printed circuit board between the opposing covers. For example, if the components on the printed circuit board are of equal heights on both sides of the printed circuit board and the printed circuit board is centrally located between the covers, and the surface-mounted clip must necessarily be mounted on one side of the printed circuit board, then it follows that the extension member reaching from the surface-mounted clip mounted on a first side of the printed circuit board must necessarily be longer to reach the cover on the opposing side of the assembly. Such asymmetry is depicted in the schematics of FIGS. 11A and 11B which exhibit exemplary proportions in millimeters for a Type II PCMCIA card embodiment.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In a circuit card assembly, an electrostatic discharge (ESD) surface-mount clip for electrically coupling a reference potential on a printed circuit board (PCB) with first and second conductive covers of said circuit card assembly, comprising:
   a) a generally planar electrically conductive spanning means including:
      i. a spanning member for spanning a cut-out area of said printed circuit board; and
      ii. first and second opposing tabs integrally and electrically attached to said spanning member for opposingly extending from said spanning member to electrically and physically contact said first and second conductive covers, respectively; and
   b) first and second opposing surface-mount pads integrally attached to opposing ends of said spanning means, said surface-mount pads for electrically and physically attaching said surface-mount clip to said printed circuit board.

2. The electrostatic discharge (ESD) surface-mount clip, as recited in claim 1, wherein said first tab comprises:
   a) a first extension member electrically and integrally coupled to said spanning member at a first end for extending away from said generally planar spanning member toward said first cover; and
   b) a first cover contact member electrically and integrally coupled to a second end of said first extension member for forming an electrical contact with said first cover.

3. The electrostatic discharge (ESD) surface-mount clip, as recited in claim 2, wherein said second tab comprises:
   a) a second extension member electrically and integrally coupled to said spanning member at a first end for extending away from said generally planar spanning member toward said second cover; and
   b) a second cover contact member electrically and integrally coupled to a second end of said second extension member for forming an electrical contact with said second cover.

4. The electrostatic discharge (ESD) surface-mount clip, as recited in claim 2, wherein said first tab further comprises:
   a) a first spring coupling said spanning member with said first end of said extension member for exerting force between said spanning member and said first extension member; and
   b) a second spring coupling said second end of said first extension member with said first cover contact member, said second spring for exerting force between said first extension member and said first cover contact member thereby providing force against said first cover to form an electrical contact with said first cover.

5. The electrostatic discharge (ESD) surface-mount clip, as recited in claim 1, wherein said first and second tabs are formed by shearing and forming opposing portions of said spanning means into said first and second opposing tabs.

6. The electrostatic discharge (ESD) surface-mount clip, as recited in claim 5, wherein first and second opposing tabs are formed into "S-shaped" curved members for extending from said spanning member to said first and second covers, respectively.

7. The electrostatic discharge (ESD) surface-mount clip, as recited in claim 1, wherein said first and second opposing tabs extend from said spanning member on opposing sides of said spanning member.

8. The electrostatic discharge (ESD) surface-mount clip, as recited in claim 1, wherein said first and second opposing tabs extend from said spanning member on the same side of said spanning member.

9. An electrostatic discharge (ESD) clip for surface mounting to a printed circuit board (PCB) in a circuit card assembly to electrically couple a reference potential on said printed circuit board with opposing first and second covers of said circuit card assembly, said clip comprising:
   a) a spanning means having formed therefrom
      i. a spanning member for traversing a cut-out area of said printed circuit board;
      ii. first and second portions of said spanning means cut and formed therefrom to form first and second opposing tabs extending from said spanning member to said first and second covers, respectively; and
         a. first and second opposing surface-mount pads integrally attached to opposing ends of said spanning means, said surface-mount pads for electrically and physically attaching said surface-mount clip to said printed circuit board.

10. The electrostatic discharge (ESD) surface-mount clip, as recited in claim 9, wherein said first tab comprises:
    a. a first extension member electrically and integrally coupled to said spanning member at a first end for extending away from said generally planar spanning member toward said first cover; and
    b. first cover contact member electrically and integrally coupled to a second end of said first extension member for forming an electrical contact with said first cover.

11. The electrostatic discharge (ESD) surface-mount clip, as recited in claim 10, wherein said second tab comprises:
    a. a second extension member electrically and integrally coupled to said spanning member at a first end for extending away from said generally planar spanning member toward said second cover; and
    b. a second cover contact member electrically and integrally coupled to a second end of said second extension member for forming an electrical contact with said second cover.

12. The electrostatic discharge (ESD) surface-mount clip, as recited in claim 10, wherein said first tab further comprises:
    a. a first spring coupling said spanning member with said first end of said extension member for exerting force between said spanning member and said first extension member; and
    b. a second spring coupling said second end of said first extension member with said first cover contact member, said second spring for exerting force between said first extension member and said first cover contact member thereby providing force against said first cover to form an electrical contact with said first cover.

13. An electrostatic discharge (ESD) surface-mount clip for electrically coupling a reference potential on a printed circuit board (PCB) with first and second conductive covers of said circuit card assembly, comprising:
    a. an electrically conductive spanning means including:
       i. a spanning member for spanning at least a portion of a cut-out area of said printed circuit board;
       ii. a first tab integrally and electrically attached to a first end of said spanning member, said first tab extending from said spanning member to electrically encounter said first cover;
       iii. a second tab integrally and electrically attached to a second end of said spanning member, said second tab extending from said spanning member to electrically encounter said second cover; and
    b. first and second opposing surface-mount pads each integrally and electrically attached to opposing ends of said spanning means, said surface-mount pads for electrically and physically attaching said surface-mount clip to said printed circuit board.

14. An electrostatic discharge (ESD) surface-mount clip for electrically coupling a reference potential on a printed circuit board (PCB) with first and second conductive covers of said circuit card assembly, comprising:
    a. first surface-mount pad for electrically and physically attaching said surface-mount clip to said printed circuit board;
    b. a first tab integrally and electrically attached at a first end to said first surface-mount pad, said first tab extending from said spanning member to electrically encounter said first cover;
    c. a spanning member integrally and electrically attached at a first end to a second end of said first tab, said spanning member for spanning at least a portion of a cut-out area of said printed circuit board;
    d. a second tab integrally and electrically attached at a first end to a second end of said spanning member, said second tab extending from said spanning member through said cut-out area of said printed circuit board to electrically encounter said second cover; and
    e. a second surface-mount pad integrally and electrically attached at a first end to a second end of said second tab, said second surface-mount pad for electrically and physically attaching said surface-mount clip to said printed circuit board.

* * * * *